United States Patent [19]

Hui

[11] Patent Number: 5,251,106
[45] Date of Patent: Oct. 5, 1993

[54] STACKABLE ENCLOSURE FOR ELECTRONIC DEVICES

[75] Inventor: John T. Hui, San Jose, Calif.

[73] Assignee: Everex Systems, Inc., Fremont, Calif.

[21] Appl. No.: 848,420

[22] Filed: Mar. 6, 1992

[51] Int. Cl.⁵ ............................................... H05K 7/00
[52] U.S. Cl. .................................... 361/744; 361/399;
 361/415; 361/420; 361/759; 361/801; 361/810;
 312/42; 220/23.4; 220/23.6; 439/292; 439/717;
 206/508
[58] Field of Search .................... 361/380, 392–396,
 361/399, 417, 419, 420, 415; 312/42, 107, 109;
 257/678, 686, 723, 797; 220/4.26, 4.27, 23.4,
 23.6; 206/503, 508, 509, 511; 439/292, 620, 717,
 928

[56] References Cited

U.S. PATENT DOCUMENTS

| | | |
|---|---|---|
| 4,048,669 | 9/1977 | Bowler et al. |
| 4,469,393 | 9/1984 | Chewning, Jr. et al. ........... 339/198 |
| 4,524,883 | 6/1985 | Herring . |
| 4,620,636 | 11/1986 | Herr et al. |
| 4,718,858 | 1/1988 | Godfrey et al. |
| 4,838,422 | 6/1989 | Gregerson . |
| 4,858,070 | 8/1989 | Buron et al. |
| 4,930,643 | 6/1990 | Flum . |
| 5,027,961 | 7/1991 | Howitt . |
| 5,042,862 | 8/1991 | Tubke . |
| 5,056,669 | 10/1991 | Villeneuve . |

FOREIGN PATENT DOCUMENTS

| | | |
|---|---|---|
| 3543885 | 12/1985 | Fed. Rep. of Germany . |
| 1194312 | 11/1959 | France . |
| 1232356 | 10/1960 | France . |
| 432065 | 6/1974 | U.S.S.R. |

Primary Examiner—Leo P. Picard
Assistant Examiner—Young S. Whang
Attorney, Agent, or Firm—Blakely, Sokoloff, Taylor & Zafman

[57] ABSTRACT

An electronic system having a plurality of electronic devices contained in a plurality of stackable enclosures is provided. Each of the plurality of stackable enclosures is stackable and interlockable together with another one of the plurality of stackable enclosures. Each of the plurality of stackable enclosures comprises a housing having a top surface and a bottom surface. A first plurality of projections are provided to extend upwardly from the top surface. The first plurality of projections are spaced to define a first group of grooves therebetween. A second plurality of projections are provided to extend downwardly from the bottom surface. The second plurality of projections are spaced to define a second group of grooves therebetween. Each of the second group of grooves corresponds to a respective one of the first plurality of projections. Each of the first group of grooves corresponds to a respective one of the second plurality of projections. When a first stackable enclosure of the plurality of stackable enclosures is stacked on top of a second stackable enclosure of the plurality of stackable enclosures, each of the second plurality of projections of the first stackable enclosure engages its respective one of the first group of grooves of the second stackable enclosure and each of the first plurality of projections of the second stackable enclosure engages its respective one of the second group of grooves of the first stackable enclosure such that the first stackable enclosure is interlocked with the second stackable enclosure. An interlocking device for stacking and interlocking a first enclosure onto a second enclosure of an electronic apparatus is also described.

18 Claims, 11 Drawing Sheets

FIG—1

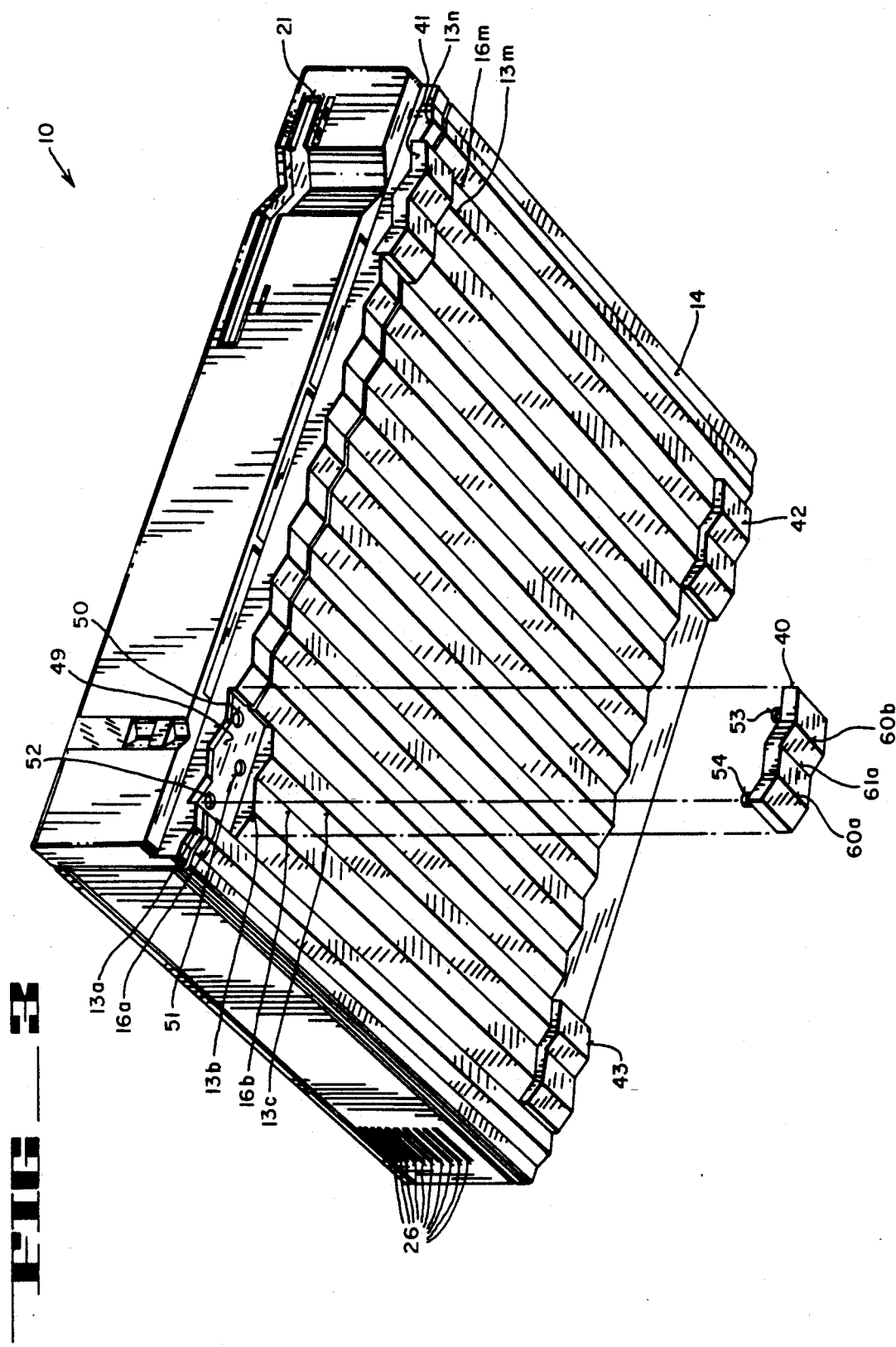

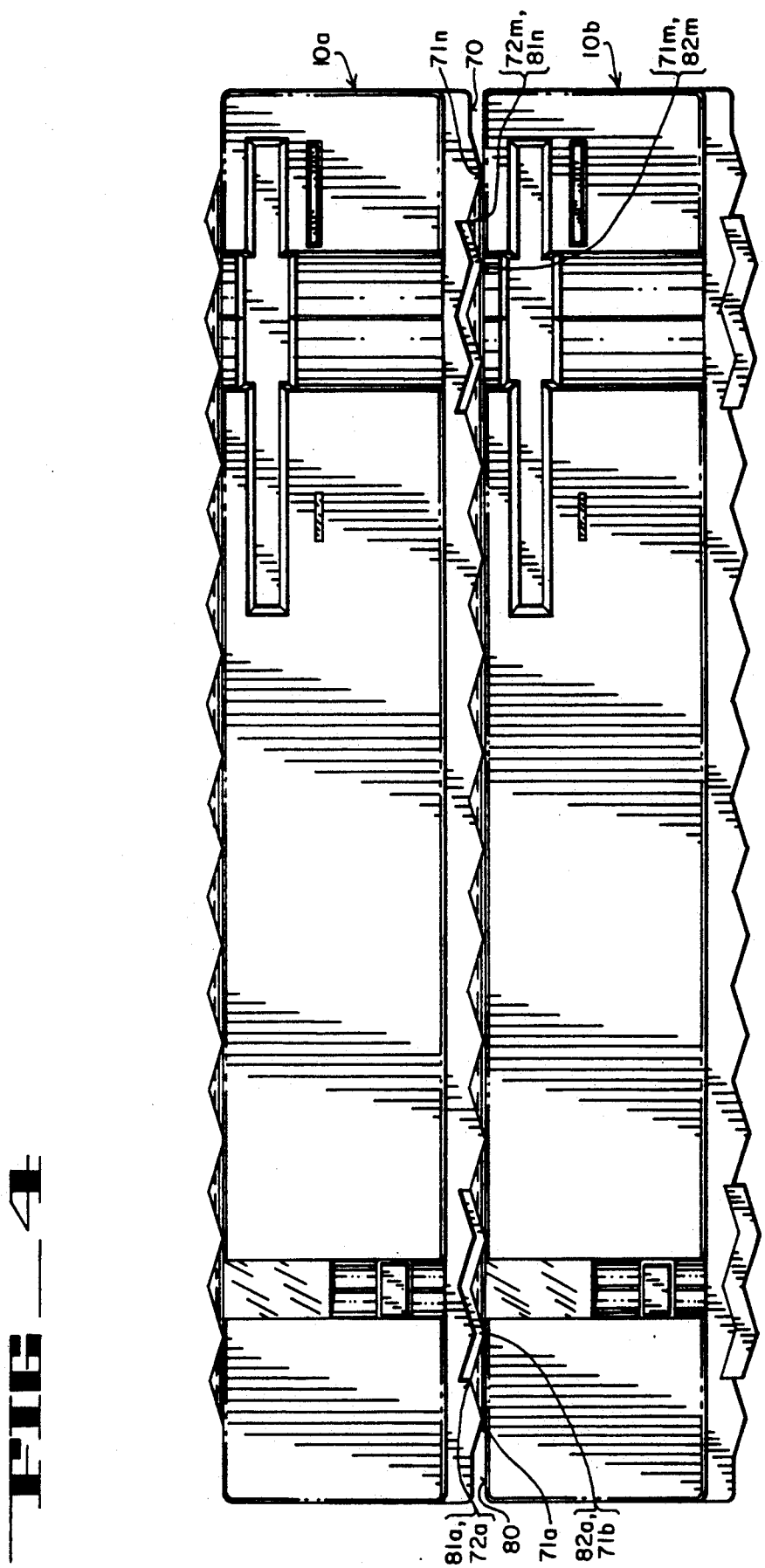

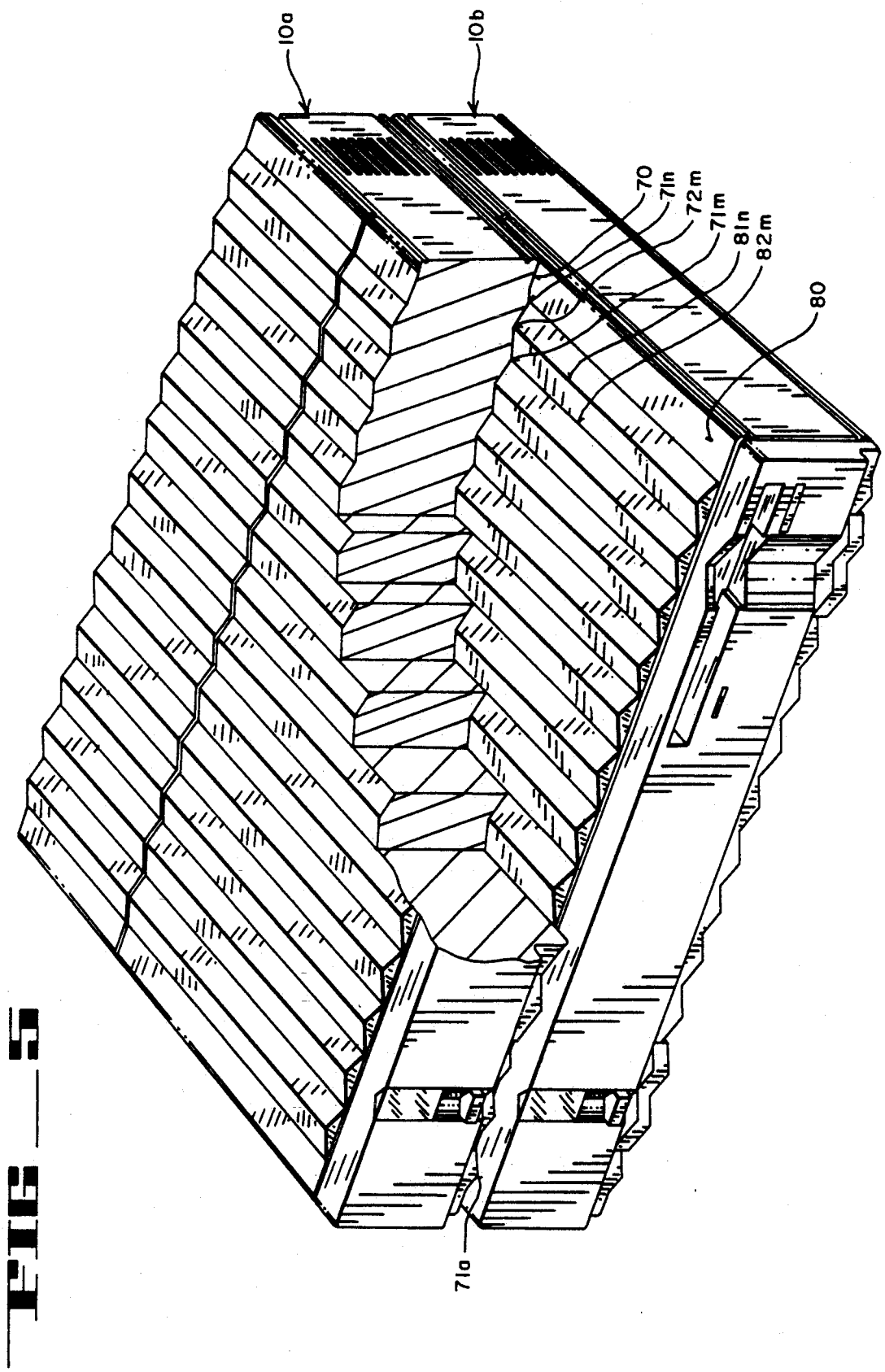
FIG_5

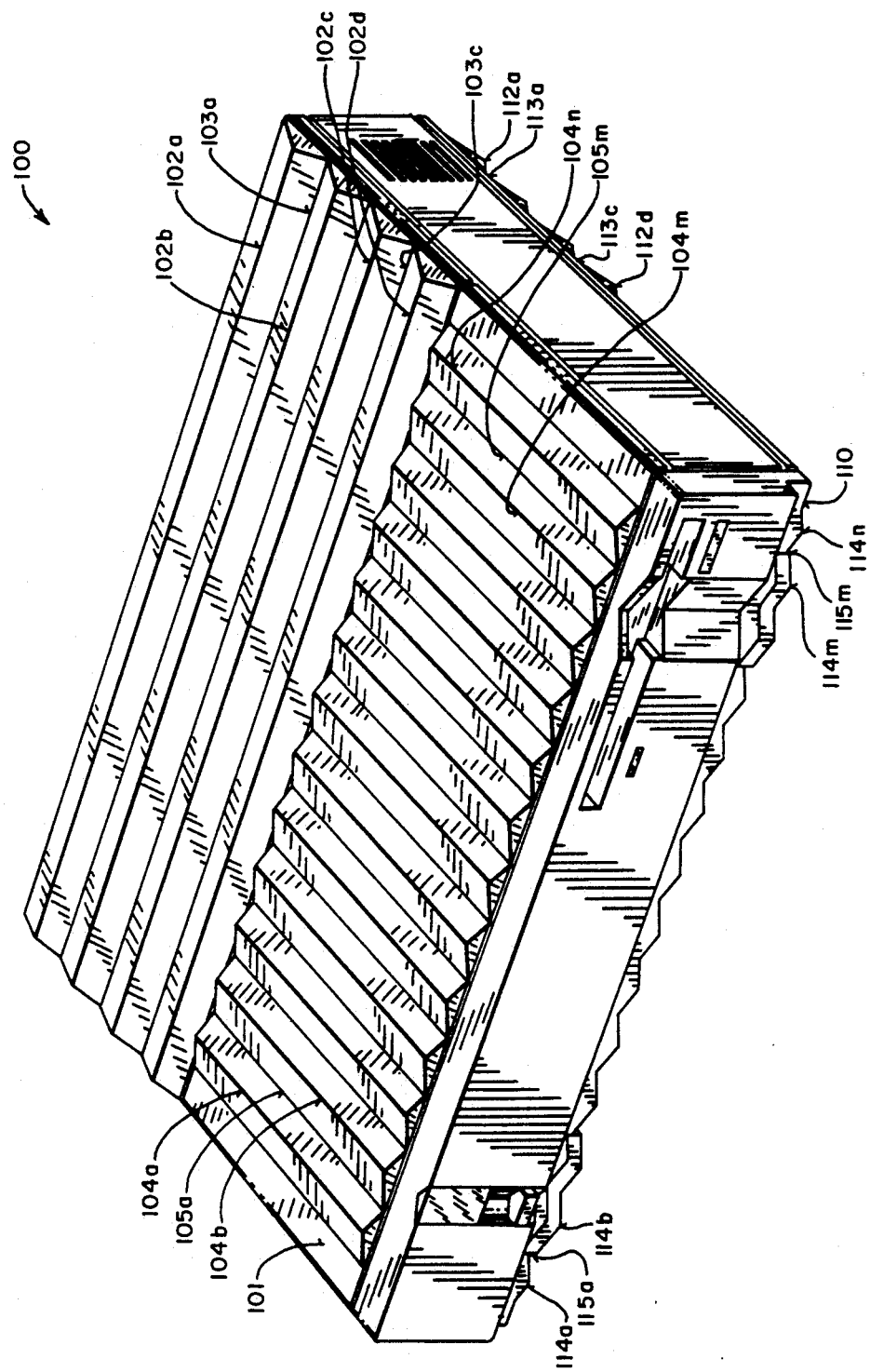
FIG_6

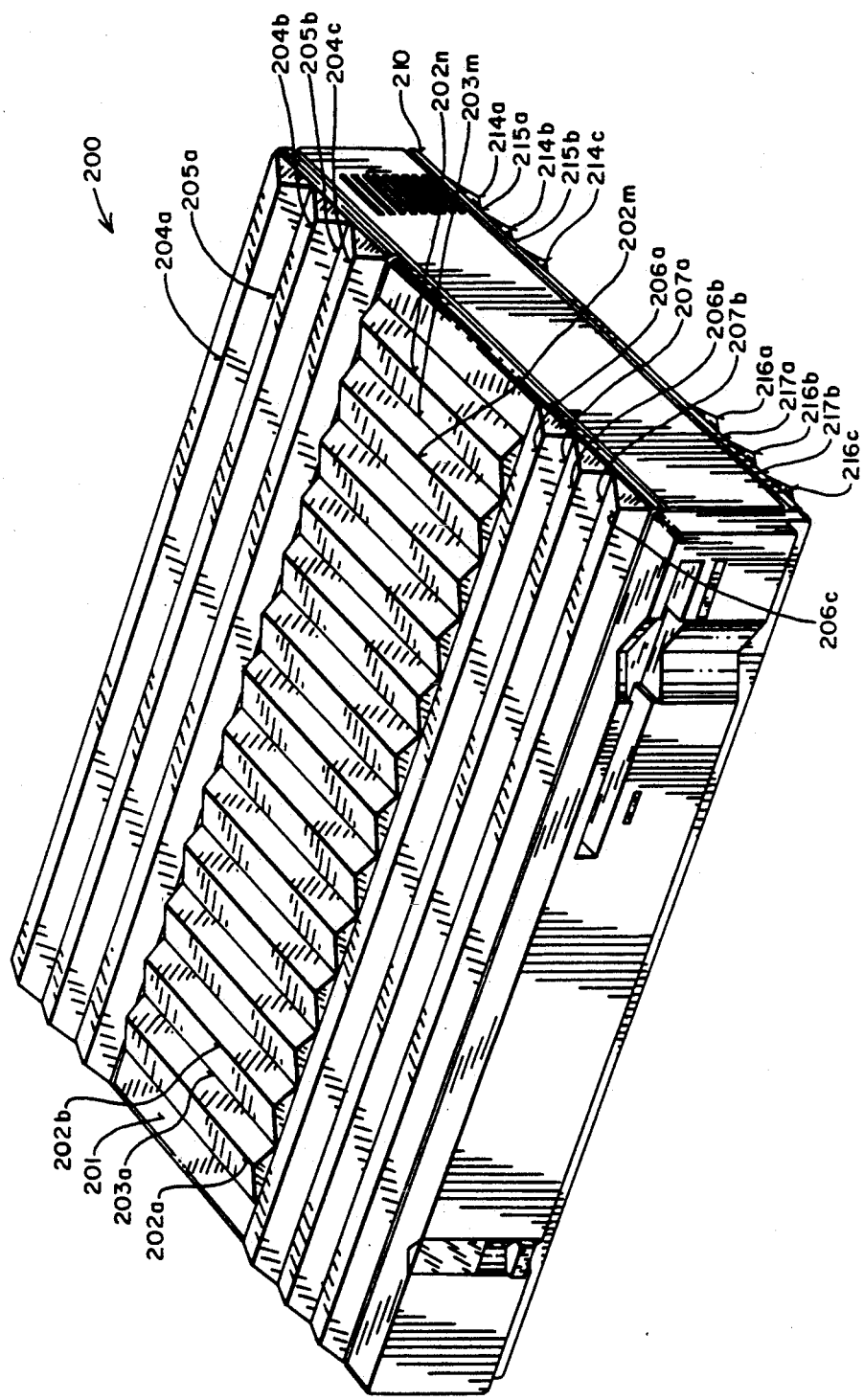
FIG—7

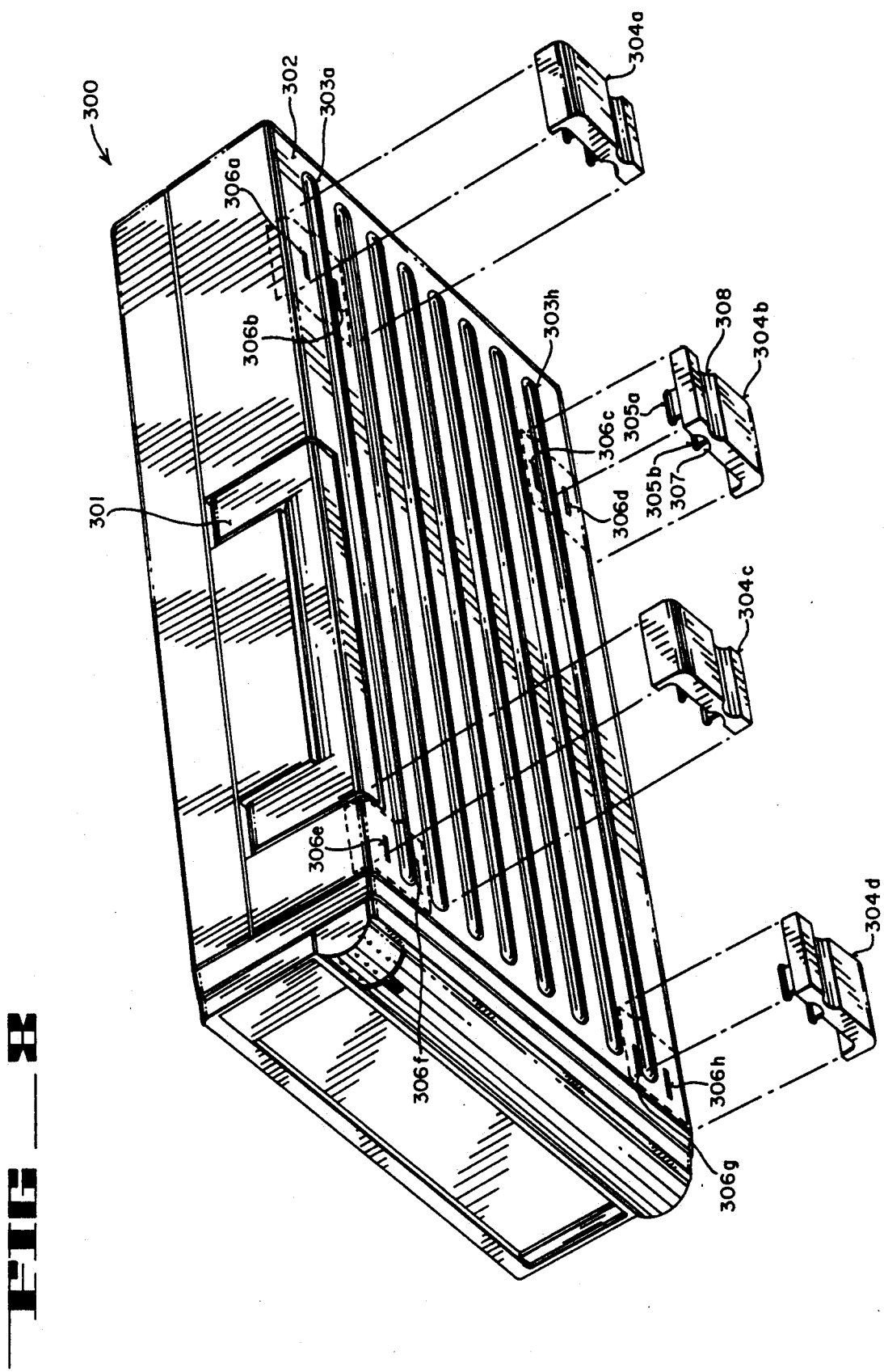
FIG-H

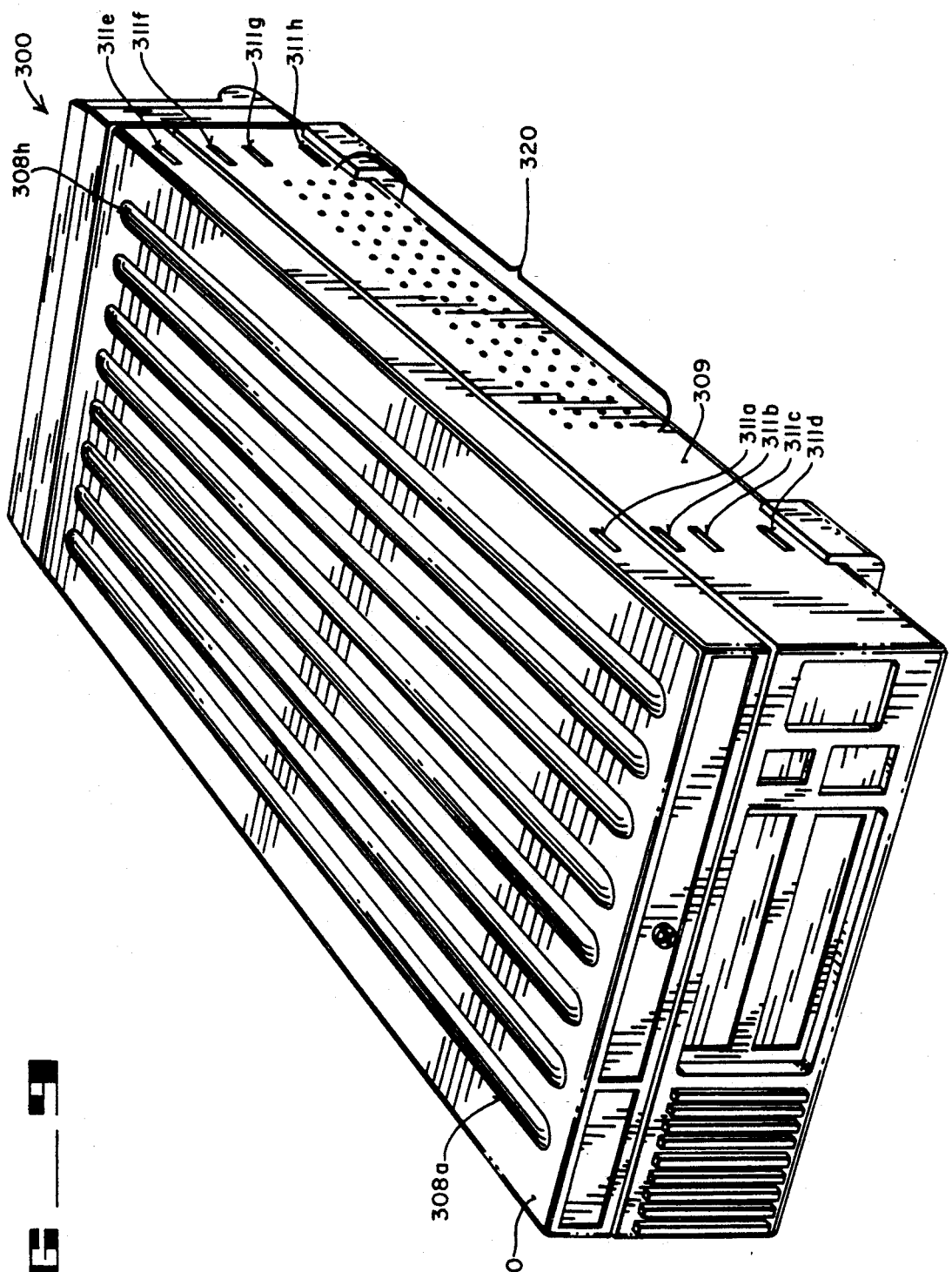

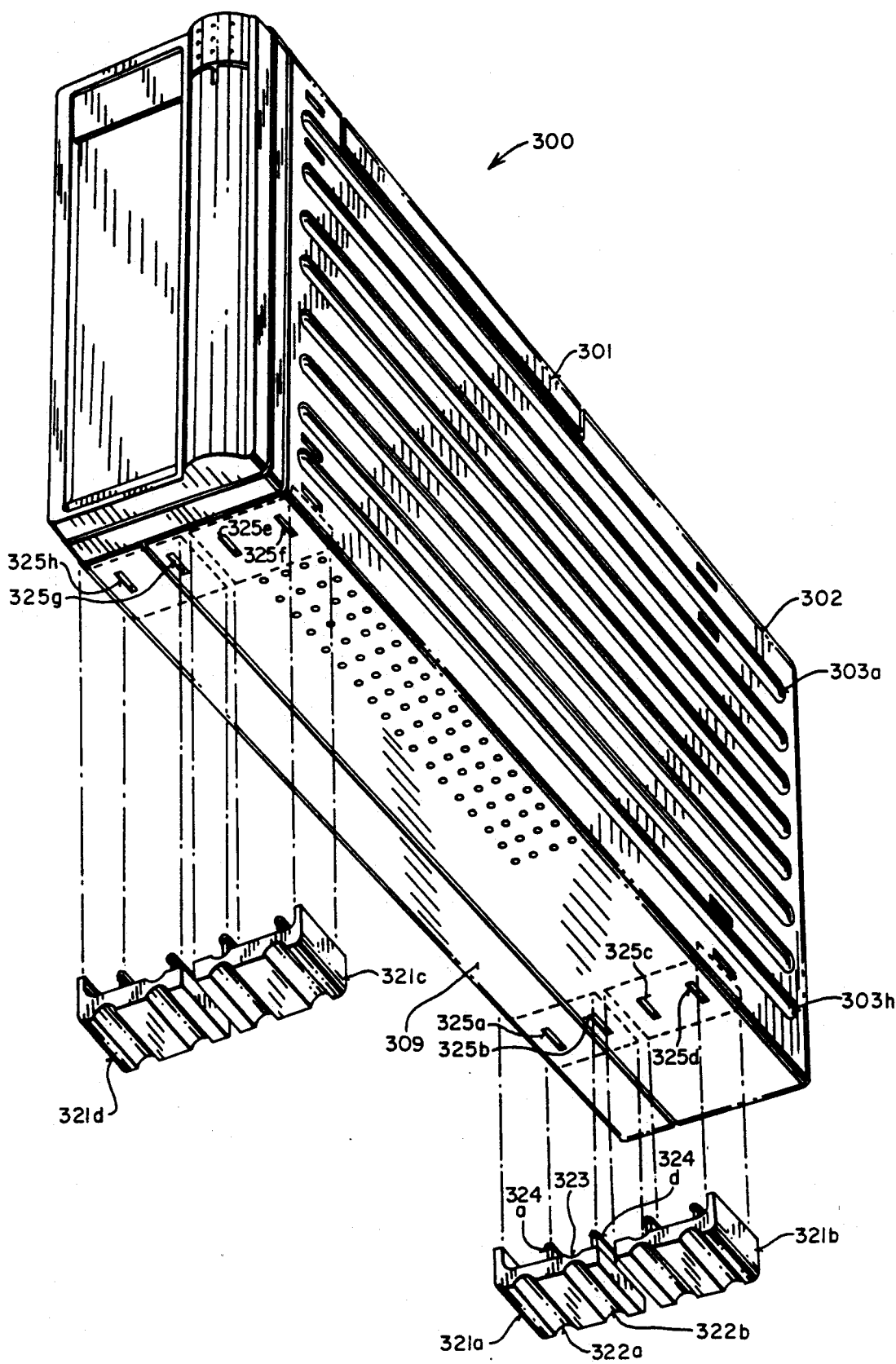

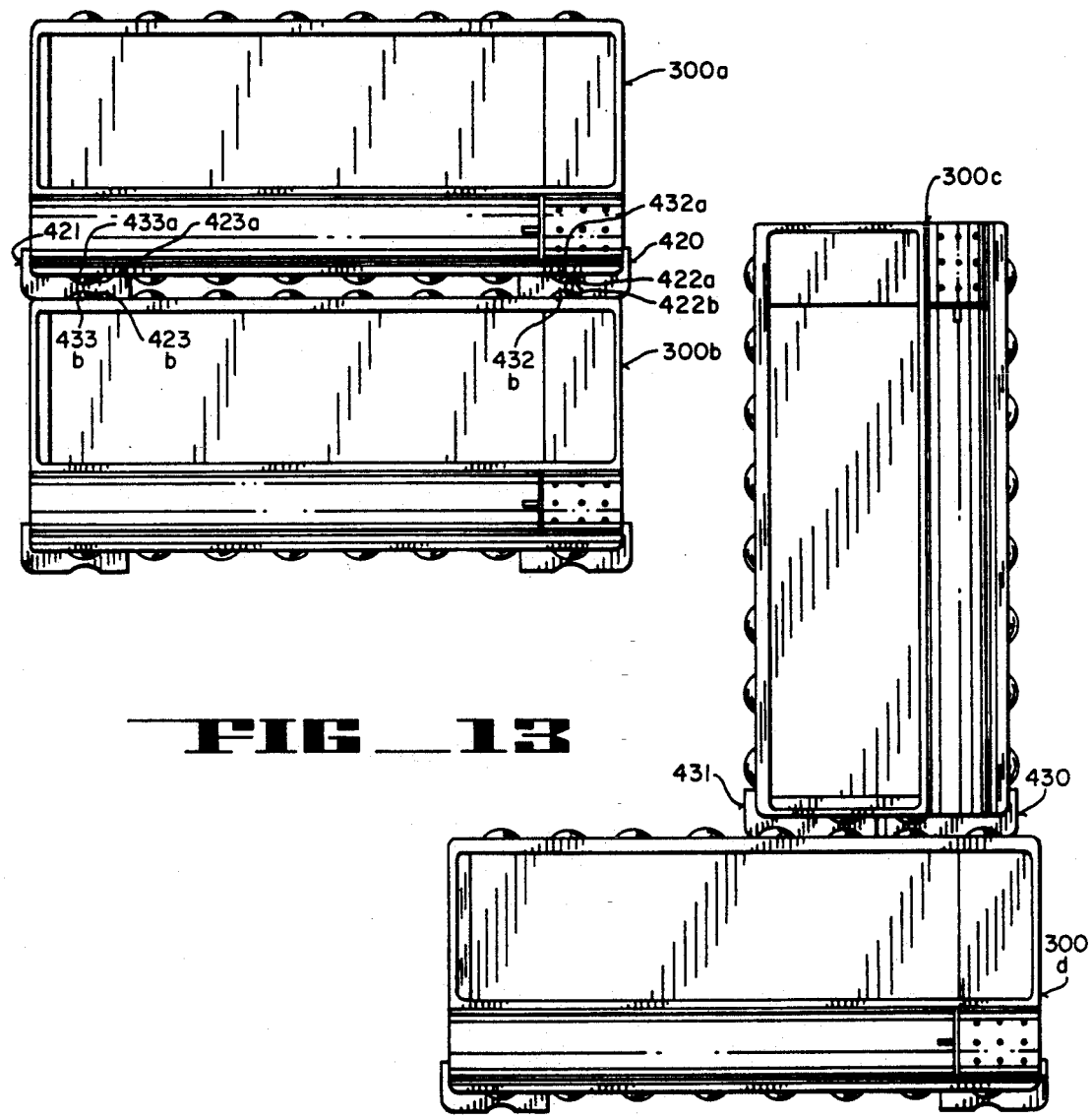

STACKABLE ENCLOSURE FOR ELECTRONIC DEVICES

FIELD OF THE INVENTION

The present invention pertains to the field of electronic devices. More particularly, this invention relates to stackable enclosures for electronic devices, wherein one of the stackable enclosures can be stacked on another one of the stackable enclosures securely.

BACKGROUND OF THE INVENTION

It has been common practice in the electronic field to contain different functional units of an electronic system in a plurality of separate housings. The functional units in each of the housings are then interconnected by connection lines external to the housings to form the electronic system. Typically, the housings are designed in modular shape and size (e.g., modules) such that they can be mass produced. The modular shape and size of the housings also make it possible for the modular housings to be stacked on one another.

One typical example of such a modular electronic system is the modular audio and/or video component system. A typical audio component system includes an amplifier component, a preamplifier component, an AM-FM radio component, a CD (i.e., compact disk) player component, a cassette player component, and a record player component. These components are typically contained in separate modular housings and are stacked on one another. Another example of such a modular electronic system is the modular computer system. A typical modular computer system includes a central computer unit contained in a modular housing, and a plurality of peripheral devices in a plurality modular housings. These modules may then be stacked together.

One advantage of the modular system is that the system does not need to reserve space for future expansion inside each component. Each modular component of the system includes minimum circuitry for the designated function of the component, and an interface circuit for communications with other components of the system. The system can function with only core modular components of the system. When the expansion of the system is needed to enhance the operational features or to provide with more functions of the system, expansion components which are also in modular form can be added to the system. For example, when additional storage is required in a modular computer system, storage expansion components, such as a disk drive, an optical storage drive, a tape drive, or additional memory can then be employed to connect to the computer system via connection lines as these expansion components are all contained in separate modular housings. In this way, the computer system can be minimum equipped under its current operating conditions. When additional functions or features are needed, the computer system can be easily expanded by adding additional component modules or replacing the existing component modules with more advanced modules.

In order to make the external connection lines of the modular system simple and short and to allow the modular system to occupy minimum surface space, the component modules in the modular system are typically stacked together.

Disadvantages, however, are associated with the stacking arrangement for the modular systems. One disadvantage associated is that the stacked component modules may be moved horizontally away from its stacked position by external force and fall off, thus damaging the electronic circuitry inside the modules.

A number of prior art approaches are known for solving this problem. One such prior art approach is shown and described in U.S. Pat. No. 4,718,858, which shows and describes stackable housings for electronic units. Each of the stackable housings includes L-shaped front feet and stacking feet on the bottom surface. Each of the stackable housings also includes, on its top surface, top securing holes (boot-shaped) for the L-shaped front feet and stacking notches for the stacking feet. When one of the stackable housings is stacked on another one of the stackable housings, the front portions of the stacked units are secured by the L-shaped feet on the stacked unit retained in the securing holes and the rear portions of the stacked units are secured by the stacking feet of the stacked unit engaging the stacking notches on the base unit.

Another prior art approach is shown and described in U.S. Pat. No. 4,838,422, which describes data storage containers that can be stacked together securely. Each of the containers has tapered parallel protruding rails on the bottom surface which lie opposite each other. Each of the containers also includes parallel rail members positioned opposite each other on the top surface of each container. The parallel members each includes an angled surface. When two of the containers are stacked together, the bottom tapered parallel rail members of the upper container are frictionally engaged via sliding with rail members of the lower container, thus securing the upper container.

One disadvantage of these prior art approaches is that they typically require extra effort to stack one stackable housing/container on top of another one securely. Similarly, extra effort is also required to remove one of the stackable housings/containers from its stacked position.

SUMMARY AND OBJECTS OF THE INVENTION

One of the objects of the present invention is to provide a stackable enclosure for electronic devices.

Another object of the present invention is to provide an easily assembled stackable enclosure for electronic devices that can be easily stacked on another stackable enclosure securely without horizontal movement on top of the base stackable enclosure caused by an external force.

Another object of the present invention is to provide means for preventing the stackable enclosures for electronic devices, when being stacked together, from being horizontally moved by an external force against their base stackable enclosures.

An electronic system having a plurality of electronic devices contained in a plurality of stackable enclosures is provided. Each of the plurality of stackable enclosures is stackable and interlockable together with another one of the plurality of stackable enclosures. Each of the plurality of stackable enclosures, in one embodiment, comprises a housing having a top surface and a bottom surface. A first plurality of projections are provided to extend upwardly from the top surface. The first plurality of projections are spaced to define a first group of grooves therebetween. A second plurality of projections are provided to extend downwardly from the bottom surface. The second plurality of projections are spaced to define a second group of grooves therebetween. Each of the second group of grooves corresponds to a respective one of the first plurality of projections. Each of the first group of grooves corresponds to a respective one of the second plurality of projections. When a first stackable enclosure of the plurality of stackable enclosures is stacked on top of a second stackable enclosure of the plurality of stackable enclosures, each of the second plurality of projections of the first stackable enclosure engages its respective one of the first group of grooves of the second stackable enclosure and each of the first plurality of projections of the second stackable enclosure engages its respective one of the second group of grooves of the first stackable enclosure such that the first stackable enclosure is interlocked with the second stackable enclosure.

An interlocking device for stacking and interlocking a first enclosure onto a second enclosure of an electronic apparatus is described. The first enclosure is used for containing electronic circuitry of the electronic apparatus. The first enclosure includes a first surface and a first plurality of projections extending outwardly from the first surface, wherein the first plurality of projections are parallel spaced. The second enclosure is used for containing electronic circuitry of the electronic apparatus. The second enclosure includes a second surface and a second plurality of projections extending outwardly from the second surface, wherein the second plurality of projections are parallel spaced. Each of the second plurality of projections corresponds to one of the first plurality of projections. The interlocking device, in one embodiment, is detachably coupled to the first surface of the first enclosure for stacking and interlocking the first enclosure onto the second enclosure. The interlocking device includes a first groove and a second groove. When the interlocking device is attached to the first surface of the first enclosure, the first groove of the interlocking device embraces one of the first plurality of projections. When the first enclosure is stacked on top of the second enclosure with the first surface facing the second surface, the second groove of the interlocking device embraces one of the second plurality of projections such that the first enclosure can be stacked on and interlocked with the second enclosure.

Other object, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar element and in which:

FIG. 3 is another perspective view of the stackable enclosure of FIG. 1, showing the bottom surface of the stackable enclosure;

FIG. 4 is a front view showing two of the stackable enclosures of FIG. 1, one being stacked on the other;

FIG. 5 is a cutaway perspective view of the two stackable enclosures of FIG. 4;

FIG. 6 is a perspective view illustrating another preferred embodiment of the stackable enclosure of FIG. 1;

FIG. 7 is a perspective view illustrating a further preferred embodiment of the stackable enclosure of FIG. 1;

FIG. 8 is a perspective view of a stackable enclosure for electronic devices according to another preferred embodiment of the present invention, illustrating the bottom surface of the stackable enclosure with a plurality of feet in their coupling position;

FIG. 9 is another perspective view of the stackable enclosure of FIG. 8;

FIG. 10 is another perspective view illustrating the stackable enclosure of FIG. 8 in an erected position with the feet in their coupling position;

FIGS. 11A and 11B illustrate two preferred embodiments of the feet employed by the stackable enclosures of FIGS. 8 and 10;

FIG. 12 is a front view showing two stackable enclosures of FIG. 8, one being stacked on the other;

FIG. 13 is another front view showing one stackable enclosure of FIG. 10 being stacked on another stackable enclosure of FIG. 8.

DETAILED DESCRIPTION

Figure 1:
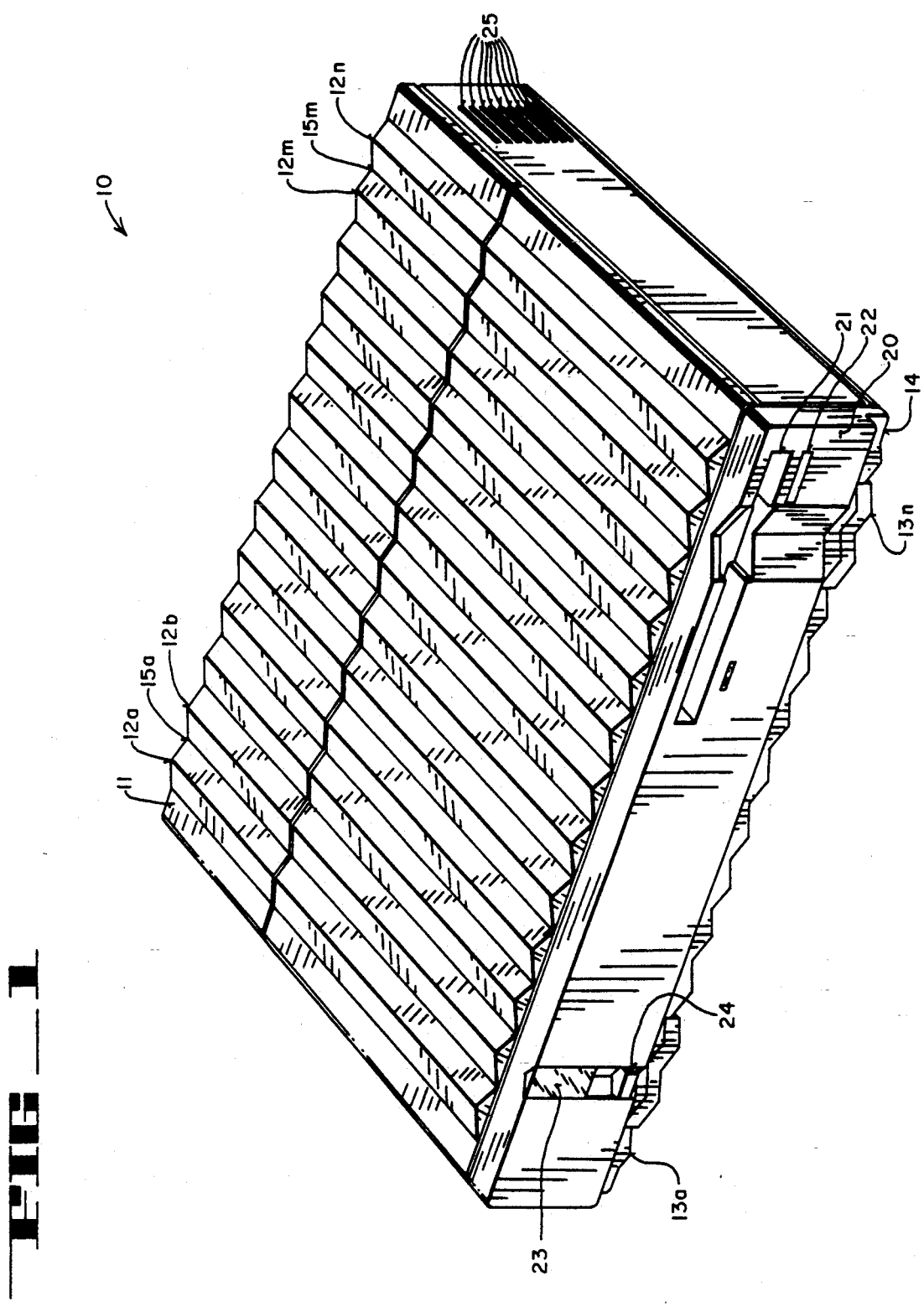
FIG. 1 is a perspective view of a stackable enclosure for electronic devices according to one preferred embodiment of the present invention.
Figure 2:
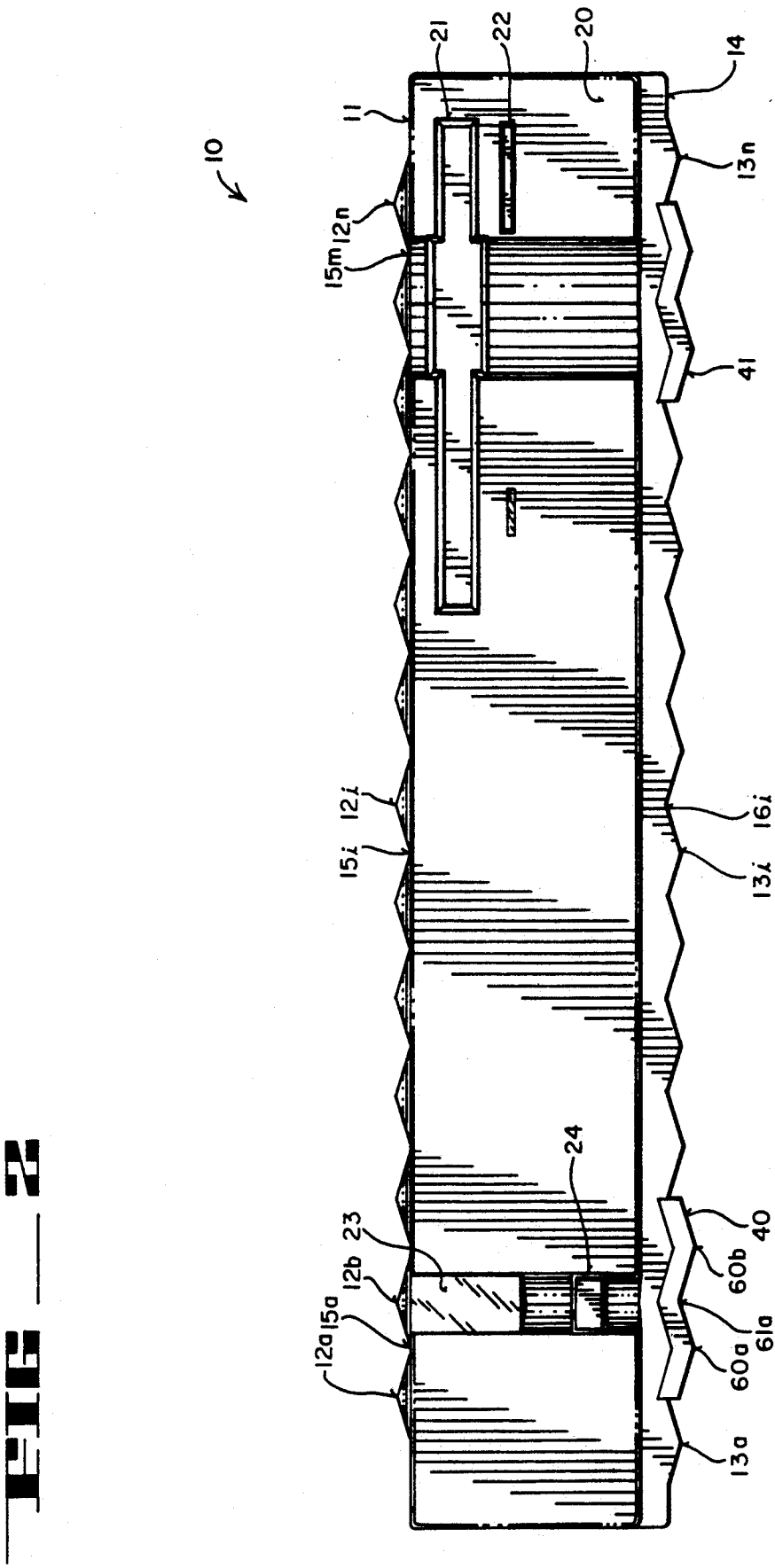
FIG. 2 is a front view of the stackable enclosure of FIG. 1.

Referring to FIGS. 1-3, a stackable enclosure 10 according to one preferred embodiment of the present invention is shown, which includes a top surface 11, a plurality of projections 12a through 12n, a bottom surface 14, and a plurality of projections 13a through 13n. FIG. 1 is a perspective view of stackable enclosure 10, illustrating the top surface 11 and projections 12a-12n on the top surface 11. FIG. 2 is a front view of stackable enclosure 10, showing projections 12a-12n and 13a-13n. FIG. 3 is another perspective view of stackable enclosure 10, illustrating the bottom surface 14 and projections 13a-13n on the bottom surface 14. FIG. 3 also illustrates four feet 40 through 43 detachably coupled to the bottom surface 14.

As can be seen from FIG. 1, stackable enclosure 10 is a flat rectangular housing designed to house electronic and/or electrical devices of an electronic system. Although stackable enclosure 10 is shown in a flat rectangular shape, it shall be noted that enclosure 10 can be of any other shapes. It shall also be noted that when an identical stackable enclosure is referred to in the description hereinafter, it does not necessarily mean that the enclosure has the identical shape and size as stackable enclosure 10. It merely means that stackable enclosure embodies the present invention as stackable enclosure 10 does.

In the presently preferred embodiment, stackable enclosure 10 is employed to contain electronic circuitry of a portable modular computer system. In this case, stackable enclosure 10 may contain all the essential and well known electronic circuitry for the computer's operation. Stackable enclosure 10 may also contain a peripheral device of the computer. In addition, stackable enclosure 10 may house electronic circuitry for system expansion of the computer, such as a CD ROM memory unit for the computer. In alternative embodiments, stackable enclosure 10 may contain components of other modular electronic systems. For example, stackable enclosure 10 may contain one or more than one of components of an audio and/or video component system. As is well known, an audio component system typically includes an amplifier component, a preamplifier component, an AM-FM radio component, a CD player component, a cassette player component, and a record player component.

In the presently preferred embodiment, stackable enclosure 10 is made from injection molded plastic material enclosing a metal case (not shown in FIG. 1). In this case, all the electronic circuitry is mounted inside the metal case. One preferred way of enclosing the metal case with the plastic material is to mold a plurality of plastic plates and fasten them to some or all sides of the metal case. In alternative embodiments, stackable enclosure 10 may be made from other materials. For example, stackable enclosure 10 may be made from rubber material.

In the embodiment in which stackable enclosure 10 houses the essential electronic circuitry of the computer, there are all the essential and well known electronic circuitry for the computer's operation inside stackable enclosure 10. It typically includes a central processing unit (CPU), memory, hard and/or floppy disk drives, input/output circuitry, and power supply.

Alternatively, some of the above mentioned units may be housed in a separate identical stackable enclosure. For example, the power supply may be housed in a separate identical enclosure and connected with the units in enclosure 10 by external connection cable.

In one embodiment, the CPU of the computer in stackable enclosure 10 comprises an 80386 microprocessor (i.e., i386 TM CPU) manufactured by Intel Corporation of Santa Clara, CA. In another embodiment, the CPU comprises an 80486 microprocessor (i.e., i486 TM CPU) also manufactured by Intel Corporation. In alternative embodiments, the CPU may comprise other types of microprocessors manufactured by other companies.

The electronic circuitry of the computer inside stackable enclosure 10 may also include other well known electronic circuits or devices, such as a serial communication interface circuit, a parallel communication interface circuit, a MODEM, and a local area network (LAN) interface circuit. It shall also be noted that the computer inside enclosure 10 can readily operate as a functional computer without the presence of some or all of these circuits. Again, as an alternative, these circuits may be housed in separate identical stackable enclosures.

The computer inside stackable enclosure 10 is then connected to a plurality of peripheral devices, such as a display and a keyboard. The display may be housed in another identical stackable enclosure.

Referring to FIG. 1, stackable enclosure 10 includes a front surface 20. On the front surface 20 as shown in FIG. 1, a slot 21 is shown which is part of a conventional floppy disk drive (see also FIGS. 2 and 3). Slot 21 allows a floppy disc to be inserted into the floppy disk drive located inside stackable enclosure 10. Adjacent slot 21, there is a light indicator 22 which, when is on, indicates the existence of the floppy disc inside the floppy disk drive.

Alternatively, stackable enclosure 10 may not include slot 21 if the computer inside enclosure 10 does not have a floppy disk drive.

Also on the front surface 20, there are located an I/O indicator 24 and a power and hard disk drive indicator 23. Power and hard disk drive indicator 23 indicates the ON and OFF condition of the computer inside and the access status to a hard disk drive of the computer. I/O indicator 24 indicates any input and/or output operation of the computer with other peripheral devices.

On the right side of stackable enclosure 10 as shown in FIG. 1, a number of slots 25 are shown which are employed to dissipate heat typically generated by the power supply away from inside stackable enclosure 10. In addition to slots 25, stackable enclosure 10 includes slots at its back surface and left side surface (both are not shown) for heat dissipation. FIG. 3 illustrates a number of slots 26 on the left side surface of stackable enclosure 10.

As stated above, stackable enclosure 10 includes a plurality of projections 12a through 12n. Projections 12a-12n are extending upwardly from the top surface 11 of stackable enclosure 10. Projections 12a-12n are parallel spaced on the top surface 11 to define a plurality of grooves 15a through 15m therebetween. For example, projections 12a and 12b define groove 15a and projections 12m and 12n define groove 15m. In the presently preferred embodiment, projections 12a-12n are inverted V-shaped ridges as shown in FIG. 1. In this case, grooves 15a-15m defined by inverted V-shaped ridges 12a-12n are V-shaped grooves. In the presently preferred embodiment, projections 12a-12n and grooves 15a-15m are integrated parts of the top surface 11.

As can be seen from FIG. 1, projections 12a-12n are running from the back of stackable enclosure 10 toward its front on the top surface 11. Alternatively, projections 12a-12n can be running from the left side of stackable enclosure 10 toward its right side. As a further alternative example, projections 12a-12n are running obliquely from the back of stackable enclosure 10 toward its front.

In alternative embodiments, projections 12a-12n can be in other forms of shapes. For example, projections 12a-12n can be contoured projections. In other alternative embodiments, projections 12a-12n are not integrated parts of the top surface 11. For example, projections 12a-12n can be mounted to the top surface 11. In this case, grooves 15a-15m defined by projections 12a-12n are also not integrated parts of the top surface 11.

As also stated above, stackable enclosure 10 includes a plurality of projections 13a-13n on the bottom surface 14. Referring to FIGS. 1-3, projections 13a-13n are extending downwardly from the bottom surface 14. Projections 13a-13n are parallel spaced on the bottom surface 14 to define a plurality of grooves 16a through 16m therebetween. For example, projections 13a and 13b define groove 16a and projections 13m and 13n define groove 16m. In the presently preferred embodiment, projections 13a-13n, like their counterparts 12a-12n, are inverted V-shaped ridges as shown in FIG. 3. In this situation, grooves 16a-16m defined by inverted V-shaped ridges 13a-13n are V-shaped grooves. In the presently preferred embodiment, projections 13a-13n and grooves 16a-16m are integrated parts of the bottom surface 14.

As also seen from FIG. 3, projections 13a-13n, like their counterparts 12a-12n, are running from the back of stackable enclosure 10 toward its front. Alternatively, projections 13a-13c can be running from the left side toward the right side on the bottom surface 14. As a further alternative example, projections 13a-13n are running obliquely from the back of stackable enclosure 10 toward its front.

Like projections 12a-12n, projections 13a-13n can be in other forms of shapes. For example, projections 13a-13n can be contoured projections. In addition, projections 13a–13n and grooves 16a–16m defined by projections 13a–13n may not be integrated parts of the bottom surface 14. Projections 13a–13n may be mounted onto the bottom surface 14.

As can be seen from FIG. 2, each of projections 12a–12n on the top surface 11 corresponds to one of grooves 16a–16m on the bottom surface 14. Each of grooves 15a–15m on the top surface 11 corresponds to one of projections 13a–13n on the bottom surface 14. The corresponding positional relation of each of projections 12a–12n on the top surface 11 with respect to each of grooves 16a–16m on the bottom surface 14 and the corresponding positional relation of each of grooves 15a–15m on the top surface 11 with respect to each of projections 13a–13n on the bottom surface 14 will be described in more detail below, in conjunction with FIGS. 4 and 5.

As can be seen from FIG. 3, stackable enclosure 10 includes four feet 40 through 43 coupled to the bottom surface 14 of stackable enclosure 10. Feet 40–43 are detachable from the bottom surface 14. Feet 40–43 each is coupled to a recessed area near each corner of the bottom surface 14. For example, foot 40 is coupled to recessed area 49 at the front right corner of the bottom surface 14. Each of the recessed areas includes a number of holes for mounting respective one of feet 40–43 to its recessed area. In the presently preferred embodiment, three holes are shown in each of the recessed areas. For example, recessed area 49 includes holes 50 through 52. In alternative embodiments, more or fewer than three holes may be included.

Each of feet 40–43 also includes the corresponding number of pins. FIG. 3 illustrates two pins 53 and 54 of foot 40. The function of the pins for each of feet 40–43 is to fit into their respective holes such that their respective foot can be mounted to its respective recessed area on the bottom surface 14. For example, when foot 40 is pressed against the bottom surface 14 at the recessed area 49, pin 53 is pushed into hole 50 and pin 54 is pushed into hole 52. A third pin (not shown in FIG. 3) is pushed into hole 51. In this way, foot 40 is mounted and fastened to the bottom surface 14 of stackable enclosure 10. Each of feet 40–43 is also made with projections and grooves in order to match with projections 13a–13n and grooves 16a–16m on the bottom surface 14. For example, foot 40 includes projection 60a which matches projection 13b and projection 60b which matches projection 13c as shown in FIG. 3. Projections 60a and 60b define groove 16a which matches groove 16b. Feet 40–43, when mounted to the bottom surface 14 of stackable enclosure 10, allow stackable enclosure 10 to be stacked on another identical stackable enclosure (i.e., base enclosure) securely with their projections and grooves engaging with the grooves and projections of the base enclosure. Feet 40–43 also allow projections 13a–13n and grooves 16a–16m to be lifted from touching anything beneath them.

Referring now to FIGS. 4 and 5, two stackable enclosures 10a and 10b are shown to be stacked together. As can be seen from FIGS. 4–5, both stackable enclosures 10a and 10b are identical to stackable enclosure 10 of FIGS. 1–3. It shall be noted that stackable enclosures 10a and 10b may be different from stackable enclosure 10 and to each other in terms of their shapes and sizes. Stackable enclosures 10a and 10b, however, embody the same inventive arrangement of the present invention as stackable enclosure 10.

FIG. 4 is a front view of stackable enclosure 10a being stacked on top of stackable enclosure 10b. FIG. 5 illustrates the engagement of the projections and grooves of the two stackable enclosures 10a and 10b when they are stacked together.

Stackable enclosure 10b is hereafter referred to as the base enclosure 10b and stackable enclosure 10a is hereinafter referred to as stacked enclosure 10a. As can be seen from FIGS. 4–5, the stacked enclosure 10a includes a bottom surface 70 and a plurality of projections 71a–71n and grooves 72a–72m on the top surface 70. The base enclosure 10b includes a top surface 80 and a plurality of projections 81a–81n and grooves 82a–82m on the top surface 80. Projections 71a–71n and 81a–81n and grooves 72a–72m and 82a–82m are arranged in the same way as those of stackable enclosure 10 of FIGS. 1–3 and will not be described in more detail below.

As can be seen from FIG. 4, stacked enclosure 10a is stacked on base enclosure 10b without its feet. Therefore, as can be seen from FIGS. 4–5, each of projections 71a–71n on the bottom surface 70 of the stacked enclosure 10a engages with its corresponding one of grooves 82a–82m on the top surface 80 of the base enclosure 10b and each of grooves 72a–72m on the bottom surface 70 of the stacked enclosure 10a engages with its corresponding one of projections 81a–81n on the top surface 80 of the base enclosure 10b. In this case, any lateral movement (i.e., the movement from the right side toward the left side of enclosures 10a and 10b or vice versa) of the stacked enclosure 10a with respect to the base enclosure 10b is prevented and the stacked enclosure 10a is securely stacked on and interlocked with the base enclosure 10b.

When feet, such as feet 40–43 as shown in FIG. 3, are coupled to the stacked enclosure 10a, the bottom surface 70 will be lifted and the projections and grooves on the feet will engage with their respective grooves and projections on the top surface 80 of the base enclosure 10b. In this case, the stacked enclosure 10a is also stacked on and interlocked with the base enclosure 10b.

Referring to FIG. 6, a perspective view of a stackable enclosure 100 according to another preferred embodiment of the present invention is shown. As can be seen from FIG. 6, stackable enclosure 100 is identical to stackable enclosure 10 of FIG. 1, except for the arrangement of the projections on the top and bottom surfaces of enclosure 100. The identical features of stackable enclosure 100 with respect to stackable enclosure 10 have been described above, in conjunction with FIGS. 1–3, and will not be repeated below.

Stackable enclosure 100 includes a first group of projections 102a through 102d extending upwardly from the left side of stackable enclosure 100 toward its right side on the top surface 101. Projections 102a–102d are located near the back of stackable enclosure 100. Alternatively, projections 102a–102d can be located near the front of stackable enclosure 100. Projections 102a–102d are parallel spaced to define grooves 103a–103c therebetween. Projections 102a–102d are inverted V-shaped ridges as is shown in FIG. 6. Grooves 103a–103c defined by projections 102a–102d are V-shaped grooves. Alternatively, projections 102a–102d can be contoured projections.

Stackable enclosure 100 also includes a plurality of projections 104a through 104n on the top surface 101. Projections 104a–104n are adjacent projection 102d, running in the direction normal to that of projections 102a–102d. Projections 104a–104n are also extending upwardly on the top surface 101 and parallel spaced to define a plurality of grooves 105a–105m therebetween. Projections 102a–102d do not intersect projections 104a–104n. Like projections 102a–102d, projections 104a–104n are inverted V-shaped ridges. In this case, grooves 105a–105m are V-shaped grooves. Alternatively, projections 104a–104n can be contoured projections.

Likewise, the bottom surface 110 of stackable enclosure 100 is configured similarly as the top surface 101. As can be seen from FIG. 6, stackable enclosure 100 includes a plurality of projections 114a–114n extending downwardly from the bottom surface 110 and a plurality of projections 112a–112d extending downwardly from the bottom surface 110. Each of projections 114a–114n corresponds to one of grooves 105a–105m on the top surface 101 and each of projections 112a–112d corresponds to one of grooves 103a–103c on the top surface 101. Projections 114a–114n are also spaced to define grooves 115a–115m therebetween and projections 112a–112d are spaced to define grooves 113a–113c therebetween. Each of grooves 115a–115m on the bottom surface 110 corresponds to one of projections 104a–104n on the top surface 101 and each of grooves 113a–113c on the bottom surface 110 corresponds to one of projections 102a–102d on the top surface 101. Projections 112a–112d and 114a–114n are inverted V-shaped ridges, like projections 102a–102d and 104a–104n. Grooves 113a–113c and 115a–115m are V-shaped grooves.

In the presently preferred embodiment, projections 102a–102c and 104a–104n are integrated parts of the top surface 101 and projections 112a–112c and 114a–114n are integrated parts of the bottom surface 110. In this situation, grooves 103a–103b and 105a–105m defined by their respective projections are also part of the top surface 101 and grooves 113a–113b and 115a–115m defined by their respective projections are also part of the bottom surface 110.

This configuration of stackable enclosure 100 allows enclosure 100 to be stacked on another identical stackable enclosure or be stacked by another identical stackable enclosure securely (The enclosure being stacked will be referred to as the base enclosure and the stacking enclosure will be referred to as the stacked enclosure). In this situation, each of projections 102a–102d of the base enclosure engages with its respective one of grooves 113a–113c of the stacked and each of grooves 103a–103c of the base enclosure engages with its respective one of projections 112a–112d of the stacked enclosure such that vertical movement of the stacked enclosure (i.e., from the front toward the back or vice versa) with respect to the base enclosure is prevented. In addition, each of projections 104a–104n of the base enclosure engages with its respective one of grooves 115a–115m of the stacked enclosure and each of grooves 105a–105m of the base enclosure engages with its respective one of grooves 114a–114n of the stacked enclosure such that lateral movement of the stacked enclosure (i.e., from the right side to the left side or vice versa) with respect to the base enclosure is also prevented. In this way, the two stacked enclosures are interlocked together securely without any vertical or lateral movement.

FIG. 7 illustrates another stackable enclosure 200 according to another preferred embodiment of the present invention. The arrangement on stackable enclosure 200 as shown in FIG. 7 is similar to that of stackable enclosure 100 of FIG. 6. The configuration of stackable enclosure 200, when being stacked with another identical enclosure, also prevents any lateral and vertical movement between the two stackable enclosures.

In FIG. 7, there are two groups of laterally running projections 204a–204c and 206a–206c on the top surface 201 of stackable enclosure 200. Between the two groups of laterally running projections 204a–204c and 206a–206c, there are a plurality of projections 202a–202n running in the direction normal to that of projections 204a–204c and 206a–206c. Projections 202a–202n, however, do not intersect projections 204a–204c and 206a–206c.

Projections 202a–202n define therebetween a plurality of grooves 203a–203m and projections 204a–204c define therebetween grooves 205a–205b. Projections 206a–206c define therebetween grooves 207a–207b. As can be seen from FIG. 7, projections 202a–202n, 204a–204c, and 206a–206c are inverted V-shaped upwardly extending ridges on the top surface 201. Grooves 203a–203m, 205a–205b, and 207a–207b are therefore V-shaped grooves. Alternatively, projections 202a–202n, 204a–204c, and 206a–206c are contoured projections.

Likewise, the bottom surface of stackable enclosure 200 is configured similarly as the top surface 201. FIG. 7 illustrates a portion of bottom projections 214a–214c and 216a–216c. FIG. 7 also illustrates a portion of grooves 215a–215b defined by bottom projections 214a–214c and grooves 217a–217b defined by bottom projections 216a–216c. The bottom surface 210 also includes a plurality of projections (not shown) running in the direction normal to that of projections 214a–214c and 216a–216c. The projections also define therebetween a plurality of grooves (also not shown). Each of bottom projections 214a–214c corresponds to one of grooves 205a–205b on the top surface 201. Each of bottom projections 216a–216c corresponds to one of grooves 207a–207b on the top surface 201. Similarly, the grooves on the bottom surface 210 also correspond to their respective projections.

Like the configuration shown in FIG. 6, this configuration of stackable enclosure 200 as shown in FIG. 7 prevents any lateral and vertical movement between any two stacked enclosures 200.

FIGS. 8–10 illustrate another stackable enclosure 300 according to another preferred embodiment of the present invention, which includes a plurality of feet 304a through 304d or 321a through 321d detachably coupled to stackable enclosure 300. FIG. 8 illustrates stackable enclosure 300 in a lie-down position with feet 304a–304d coupled to a first surface 302 of stackable enclosure 300. FIG. 9 illustrates stackable enclosure 300 in the lie-down position. FIG. 9 also shows a second surface 310 of stackable enclosure 300 which is the opposite surface of first surface 302. FIG. 10 illustrates stackable enclosure 300 in an erected position, with a number of feet 321a–321d detachably coupled to a third surface 309 of stackable enclosure 300.

Both feet 304a–304d shown in FIG. 8 and feet 321a–321d shown in FIG. 10 are employed as interlocking means for stacking and interlocking any two stackable enclosures 300 together. Feet 304a–304d are used to couple to stackable enclosure 300 in the lie-down position. Feet 321a–321d are employed to couple to enclosure 300 in the erected position. Feet 304a–304d and 321a–321d will be described in more detail below, in conjunction with FIGS. 11A–13.

Like stackable enclosure 10 of FIGS. 1-3, stackable enclosure 300 is also designed to house electrical and/or electronic devices of an electronic system, such as a computer system. As can be seen from FIGS. 8-10, stackable enclosure 300 is a flat rectangular housing with a handle 301. As also can be seen from FIGS. 8-10, stackable enclosure 300 can be either in the lie-down position as shown in FIG. 9 or in the erected position as shown in FIG. 10.

As can be seen from FIG. 8, handle 301 is shown in its retracted position. When needed, handle 301 can be lifted to an extended position which allows the user to carry stackable enclosure 300 from place to place.

Stackable enclosure 300 is made from injection molded plastic material. Inside enclosure 300, there is mounted with the electronic circuitry of an electronic system. Like stackable enclosure 10 of FIGS. 1-3, stackable enclosure 300 can also contain essential electronic circuitry for a computer system. For example, stackable enclosure 300 may contain a hard disk drive of the computer system.

Stackable enclosure 300 includes a number of projections 303a-303h spaced parallel on the first surface 302. Projections 303a-303h are running parallel to the direction of handle 301 as shown in FIG. 8. Alternatively, projections 303a-303h can run vertically from the end adjacent handle 301 toward the other end. Projections 303a-303h are extending outwardly from the first surface 302. In the present preferred embodiment, projections 303a-303h are contoured ribs spaced apart on the first surface 302. In alternative embodiments, projections 303a-303h may be in other shapes. For example, projections 303a-303h may be inverted V-shaped ridges. Adjacent both ends of projection 303a, there are located two pairs of slots 306a-306b and 306e-306f along both sides of projection 303a. Likewise, adjacent both ends of projections 303h, there are also two pairs of slots 306c-306d and 306g-306h along both sides of projections 303h. Each pair of slots are employed for coupling their respective one of feet 304a-304d to the first surface 302.

FIG. 9 illustrates the second surface 310 of stackable enclosure 300. On the second surface 310, there are also located a number of projections 308a-308h spaced parallel and extending outwardly, like projections 303a-303h. Each of projections 308a-308h are arranged in the same manner on the second surface 310 as each of projections 303a-303h on the first surface 302. Each of projections 303a-303h on the first surface 302 corresponds to each of projections 308a-308h on the second surface 310. When stackable enclosure 300 is in the lie-down position as shown in FIG. 9, the first surface 302 is the bottom surface and the second surface 310 is the top surface.

As also can be seen from FIG. 9, stackable enclosure 300 includes a third surface 309 which is a side surface of the first and second surfaces 302 and 310. The third surface 309 is a flat surface with an array of holes 320 and a number of slots 311a-311h. Slots 311a-311h are located adjacent one end of the third surface 309 and slots 311e-311h are located adjacent the other end of the third surface 309. Slots 311a-311h are designed to engage with feet 321a-321d (shown in FIG. 10). The array of holes 320 are employed to dissipate heat generated from the inside of stackable enclosure 300.

FIG. 10 illustrates stackable enclosure 300 in the erected position with the third surface 309 as the bottom surface. FIG. 10 also shows the third surface 309 coupled with four feet 321a-321d.

As can be seen from FIGS. 8-10, the configuration of projections 303a-303h on the first surface 302 and projections 308a-308h on the second surface 310 makes stackable enclosure 300 unable to stack on another identical stackable enclosure 300 or to be stacked by another identical stackable enclosure 300 or other things. Therefore, it is necessary to provide stackable enclosure 300 with devices that can make stackable enclosure 300 stackable.

As can be seen from FIG. 8, feet 304a-304d are coupled to the first surface 302 to make enclosure 300 stackable in the lie-down position. As also can be seen from FIG. 10, feet 321a-321d are coupled to the third surface 309 to make stackable enclosure 300 stackable in the erected position. The structure of feet 304a-304d is described below, in conjunction with FIG. 11A. The structure of feet 321a-321d is described below, in conjunction with FIG. 11B.

Referring to FIG. 11A, an enlarged perspective view of a foot 400 is shown. Foot 400 can be any one of feet 304a-304d shown in FIG. 8.

In FIG. 11A, foot 400 includes a flat bar structure 401 with one end extending upwardly to form an L-shaped structure. On both surfaces of bar 401, there are grooves 402 and 403 extending inwardly. Grooves 402 and 403 correspond to each other in terms of their positional relation. Groove 403 is employed to embrace its respective projection of the enclosure its respective foot is coupled to and groove 402 is employed to embrace its respective projection of the base enclosure its enclosure is stacked on. Also on the top surface of bar 401, there is a pair of protrusions 404a-404b extending upwardly. As stated above, the function of protrusions 404a and 404b is to fit into their respective slots on the first surface 302 of stackable enclosure 300 such that foot 400 can be attached to the surface 302 of stackable enclosure 300. Protrusions 404a and 404b are partitioned by groove 403. Each of grooves 402 and 403 is in circular shape 50 so as to fit the shape of projection it engages when the foot is attached to stackable enclosure 300.

In the presently preferred embodiment, foot 400 is made from rubber material. In alternative embodiments, foot 400 may be made by other elastic materials or non-elastic materials.

Referring to FIG. 11B, an enlarged perspective view of another foot 410 is shown. Foot 410 is identical to foot 400 of FIG. 11A, except that foot 410 includes two grooves 412a and 412b on its bottom surface. The identical features of foot 410 with respect to foot 400 of FIG. 11A have been described above and will not be repeated below. FIG. 11B also shows a groove 413 on the top surface of foot 410. Alternatively, foot 410 may not include groove 413. Foot 410 can function without groove 413.

Grooves 412a and 412b are spaced in the same distance as any two of projections 308a-308h (FIG. 9) are spaced. Like groove 402 of foot 400 (FIG. 11A), grooves 412a-412b are employed to embrace their respective projections on the base enclosure.

Referring back to FIG. 8, when feet 304a-304d are coupled to the first surface 302 of enclosure 300, each of their respective grooves facing the first surface 302 embraces its corresponding projection. For example, when foot 304b is coupled to the first surface 302 with its protrusions fitting into slots 306c and 306d, respectively, groove 307 embraces projection 303h. Feet 304a–304d make enclosure 300 stackable on another stackable enclosure 300. As can be seen from FIGS. 8 and 11A, each of feet 304a–304d also includes another groove in the corresponding position, such as groove 308 of foot 304b on the other surface. When stackable enclosure 300 is stacked onto another stackable enclosure 300 (i.e. base enclosure) in the lie-down position as shown in FIG. 9, feet 304a–304d have these grooves embracing their respective projections on the second surface of the base enclosure. FIG 12 illustrates the stacking which will be described below.

Referring to FIG. 12, two stackable enclosures 300a and 300b are shown to be stacked together. As shown, the stacking and interlocking of stackable enclosures 300a–300b are accomplished by feet 420 and 421. FIG. 12 only shows feet 420 and 421. As can be seen from FIG. 12, stackable enclosures 300a and 300b are stackable enclosure 300 in the lie-down position. Stackable enclosure 300a is stacked on stackable enclosure 300b.

As can be seen from FIG. 12, foot 420 has each of its two grooves 422a and 422b on both surfaces embraces its respective one of projections 432a and 432b and feet 421 has each of its two grooves 423a and 423b on both surfaces embraces its respective one of projections 433a and 433b. Projections 432a and 433a are on stackable enclosure 300a and projections 423b and 433b are on stackable enclosure 300b. In this way, stackable enclosure 300a is stacked on and interlocked with stackable enclosure 300b and any movement of stackable enclosure 300a on top of stackable enclosure 300b in the direction normal to the projections are prevented.

Referring now to FIG. 10, when stackable enclosure 300 is in the erected position and needs to be stacked on another stackable enclosure 300 in the lie-down position, feet 321a–321d are coupled to the third surface 309. In this case, the protrusions on each of feet 321a–321d are fitted into its respective one of slots 325a–325h, thus making feet 321a–321d coupled to the third surface 309 of stackable enclosure 300. When stackable enclosure 300 of FIG. 10 is stacked onto another stackable enclosure 300 (i.e., the base enclosure) in the lie-down position as shown in FIG. 9, the grooves on the bottom surface of each of feet 321a–321d embrace their respective projections on the base enclosure, making erected stackable enclosure 300 (FIG. 10) stackable on another enclosure 300 which is in the lie-down position (FIG. 9). FIG. 13 illustrates the situation. As can be seen from FIG. 13, feet 430 and 431 allow stackable enclosure 300c which is in the erected position to be stacked on stackable enclosure 300d which is in the lie-down position. Feet 430 and 431 also interlock enclosure 300c with enclosure 300d without any lateral movement of stackable enclosure 300c in the direction normal to the projection on enclosure 300d.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

I claim:

1. A stackable electronic device enclosure, comprising:
    (A) a housing having a top surface and a bottom surface;
    (B) a first plurality of projections extending upwardly from said top surface, wherein said first plurality of projections are spaced to define a first group of grooves therebetween;
    (C) a second plurality of projections extending downwardly from said bottom surface, wherein said second plurality of projections are spaced to define a second group of grooves therebetween, wherein each of said second group of grooves corresponds to a respective one of said first plurality of projections, wherein each of said first group of grooves corresponds to a respective one of said second plurality of projections, wherein said first and second plurality of projections comprise spaced parallel ridges running from the back of said stackable electronic device enclosure toward its front.

2. The stackable device enclosure of claim 1, wherein said ridges are inverted V-shaped ridges and said first and second groups of grooves are V-shaped grooves.

3. The electronic system of claim 1, wherein said first plurality of projections comprise
    (1) a first set of spaced parallel ridges running vertically from the back of said stackable electronic device enclosure toward its front, wherein said first set of ridges define a first set of grooves of said first group of grooves therebetween; and
    (2) a second set of spaced parallel ridges running laterally with respect to said first set of ridges, wherein said second set of ridges define a second set of grooves of said first group of grooves therebetween, wherein said first set of ridges do not intersect said second set of ridges;
wherein said second plurality of projections comprise
    (3) a third set of spaced parallel ridges running vertically from the back of said stackable electronic device enclosure toward its front, wherein said third set of ridges define a third set of grooves of said second group of grooves therebetween; and
    (4) a fourth set of spaced parallel ridges running laterally with respect to said third set of ridges, wherein said fourth set of ridges define a fourth set of grooves of said second group of grooves therebetween, wherein said third set of ridges do not intersect said fourth set of ridges, wherein each of said first set of grooves corresponds to a respective one of said third set of ridges, wherein each of said second set of grooves corresponds to a respective one of said fourth set of ridges, wherein each of said third set of grooves corresponds to a respective one of said first set of ridges, wherein each of said fourth set of grooves corresponds to a respective one of said second set of ridges.

4. An electronic system having a plurality of electronic devices contained in a plurality of stackable enclosures, wherein each of the plurality of stackable enclosures is stackable and interlockable together with another one of the plurality of stackable enclosures, wherein each of the plurality of stackable enclosures comprises:
    (A) a housing having a top surface and a bottom surface;
    (B) a first plurality of projections extending upwardly from said top surface, wherein said first plurality of projections are spaced to define a first group of grooves therebetween;
    (C) a second plurality of projections extending downwardly from said bottom surface, wherein said second plurality of projections are spaced to define a second group of grooves therebetween, wherein each of said second group of grooves corresponds to a respective one of said first plurality of projections, wherein each of said first group of grooves corresponds to a respective one of said second plurality of projections, wherein when a first stackable enclosure of said plurality of stackable enclosures is stacked on top of a second stackable enclosure of said plurality of stackable enclosures, each of said second plurality of projections of said first stackable enclosure engages its respective one of said first group of grooves of said second stackable enclosure and each of said first plurality of projections of said second stackable enclosure engages its respective one of said second group of grooves of said first stackable enclosure such that said first stackable enclosure is interlocked with said second stackable enclosure, wherein said first and second plurality of projections comprise spaced parallel ridges running from the back of each of said plurality of stackable enclosures toward its front.

5. The electronic system of claim 4, wherein said ridges are inverted V-shaped ridges and said first and second groups of grooves are V-shaped grooves.

6. The electronic system of claim 4, wherein said first plurality of projections comprise (1) a first set of spaced parallel ridges running vertically from the back of each of said plurality of stackable enclosures toward its front, wherein said first set of ridges define a first set of grooves of said first group of grooves therebetween; and (2) a second set of spaced parallel ridges running laterally with respect to said first set of ridges, wherein said second set of ridges define a second set of grooves of said first group of grooves therebetween, wherein said first set of ridges do not intersect said second set of ridges;

wherein said second plurality of projections comprise (3) a third set of spaced parallel ridges running vertically from the back of each of said plurality of stackable enclosures toward its front, wherein said third set of ridges define a third set of grooves of said second group of grooves therebetween; and (4) a fourth set of spaced parallel ridges running laterally with respect to said third set of ridges, wherein said fourth set of ridges define a fourth set of grooves of said second group of grooves therebetween, wherein said third set of ridges do not intersect said fourth set of ridges, wherein each of said first set of grooves corresponds to a respective one of said third set of ridges, wherein each of said second set of grooves corresponds to a respective one of said fourth set of ridges, wherein each of said third set of grooves corresponds to a respective one of said first set of ridges, wherein each of said fourth set of grooves corresponds to a respective one of said second set of ridges.

7. The electronic system of claim 6, wherein when said first stackable enclosure is stacked on top of said second stackable enclosure, (1) each of said first set of grooves of said second stackable enclosure engages its respective one of said third set of ridges of said first stackable enclosure and each of said third set of grooves of said first stackable enclosure engages its respective one of said first set of ridges of said second stackable enclosure to prevent any lateral movement of said first stackable enclosure with respect to said stackable enclosure, and (2) each of said second set of grooves of said second stackable enclosure engages its respective one of said fourth set of ridges of said first stackable enclosure and each of said fourth set of grooves of said first stackable enclosure engages its respective one of said second set of ridges of said second stackable enclosure to prevent any vertical movement of said first stackable enclosure with respect to said second stackable enclosure.

8. The electronic system of claim 4, wherein said spaced parallel ridges are running obliquely from the back of each of said plurality of stackable enclosures toward its front such that any vertical and lateral movement of said first stackable enclosure with respect to said second stackable enclosure is prevented, wherein said ridges are inverted V-shaped ridges and said first and second groups of grooves are V-shaped grooves.

9. An apparatus for stacking a first enclosure onto a second enclosure, wherein the first enclosure includes a bottom surface and the second enclosure includes a top surface, wherein the apparatus comprises:

(A) a first plurality of projections extending upwardly from said top surface of said second enclosure, wherein said first plurality of projections are spaced to define a first group of grooves therebetween;

(B) a second plurality of projections extending downwardly from said bottom surface of said first enclosure, wherein said second plurality of projections are spaced to define a second group of grooves therebetween, wherein each of said second group of grooves corresponds to a respective one of said first plurality of projections, wherein each of said first group of grooves corresponds to a respective one of said second plurality of projections, wherein when said first enclosure is stacked on top of said second enclosure, each of said second plurality of projections of said first enclosure engages its respective one of said first group of grooves of said second enclosure and each of said first plurality of projections of said second enclosure engages its respective one of said second group of grooves of said first enclosure such that said first enclosure is interlocked with said second enclosure, wherein said first and second plurality of projections comprise spaced parallel ridges running from the back of each of said first and second enclosures toward its front.

10. The apparatus of claim 9, wherein said ridges are inverted V-shaped ridges and said first and second groups of grooves are V-shaped grooves.

11. The apparatus of claim 9, wherein said first plurality of projections comprise (1) a first set of spaced parallel ridges running vertically from the back of said second enclosure toward its front, wherein said first set of ridges define a set of grooves of said first group of grooves therebetween; and (2) a second set of spaced parallel ridges running laterally with respect to said first set of ridges, wherein said second set of ridges define a second set of grooves of said first group of grooves therebetween, wherein said first set of ridges do not intersect said second set of ridges;

wherein said second plurality of projections comprise (3) a third set of spaced parallel ridges running vertically from the back of said first enclosure toward its front, wherein said third set of ridges define a third set of grooves of said second group of grooves therebetween; and (4) a fourth set of spaced parallel ridges running laterally with respect to said third set of ridges, wherein said third set of ridges do not intersect said fourth set of ridges, wherein said fourth set of ridges define a fourth set of grooves of said second group of grooves therebetween, wherein each of said first set of grooves corresponds to a respective one of said third set of ridges, wherein each of said second set of grooves corresponds to a respective one of said fourth set of ridges, wherein each of said third set of grooves corresponds to a respective one of said first set of ridges, wherein each of said fourth set of grooves corresponds to a respective one of said second set of ridges.

12. The electronic system of claim 11, wherein when said first enclosure is stacked on top of said second enclosure, (1) each of said first set of grooves of said second enclosure engages its respective one of said third set of ridges of said first enclosure and each of said third set of grooves of said first enclosure engages its respective one of said first set of ridges of said second enclosure to prevent any lateral movement of said first enclosure with respect to said second enclosure and (2) each of said second set of grooves of said second enclosure engages its respective one of said fourth set of ridges of said first enclosure and each of said fourth set of grooves of said first enclosure engages its respective one of said second set of ridges of said second enclosure to prevent any vertical movement of said first enclosure with respect to said second enclosure.

13. The electronic system of claim 9, wherein said spaced parallel ridges are running obliquely from the back of each of said first and second enclosures toward its front such that any vertical and lateral movement of said first enclosure with respect to said second enclosure is prevented.

14. An electronic apparatus, comprising:
   (A) a first enclosure for containing electronic circuitry of said electronic apparatus, wherein said first enclosure includes:
      (i) a first surface;
      (ii) a first plurality of projections extending outwardly from said first surface, wherein said first plurality of projections are parallel spaced;
   (B) a second enclosure for containing electronic circuitry of said electronic apparatus, wherein said second enclosure includes:
      (iii) a second surface;
      (iv) a second plurality of projections extending outwardly from said second surface, wherein said second plurality of projections are parallel spaced, wherein each of said second plurality of projections corresponds to one of said first plurality of projections; and
   (C) interlocking means detachably coupled to said first surface of said first enclosure for stacking and interlocking said first enclosure onto said second enclosure, wherein said interlocking means includes a first groove and a second groove, wherein when said interlocking means is attached to said first surface of said first enclosure, said first groove of said interlocking means embraces one of said first plurality of projections, wherein when said first enclosure is stacked on top of said second enclosure with said first surface facing said second surface, said second groove of said interlocking means embraces one of said second plurality of projections such that said first enclosure can be stacked on and interlocked with said second enclosure, wherein said first enclosure further comprises a third surface normal to said first surface, wherein said third surface is a substantially flat surface, wherein said interlocking means can also be attached to said third surface, wherein when said interlocking means is attached to said third surface, said first enclosure can be stacked on said second enclosure with said third surface facing said second surface and interlocked with said second enclosure by said interlocking means.

15. The electronic apparatus of claim 14, wherein said interlocking means further comprises a third groove, wherein when said interlocking means is attached to said third surface, each of said second and third grooves embraces one of said second plurality of projections such that said first enclosure can be stacked on said second enclosure with said third surface facing said second surface and interlocked with said second enclosure by said interlocking means.

16. The electronic apparatus of claim 14, wherein said first enclosure includes a plurality of slots on said first surface between some of said first plurality of projections, wherein said interlocking means includes a plurality of protrusion, wherein when said interlocking means is pressed toward said first surface, each of said protrusions fits into each of said slots such that said interlocking means is attached to said first enclosure.

17. A method for stacking and interlocking a first enclosure onto a second enclosure, wherein the first enclosure includes a bottom surface and the second enclosure includes a top surface, wherein the method comprises the steps of:
   (A) providing a first plurality of projections extending upwardly from said top surface of said second enclosure, wherein said first plurality of projections are spaced to define a first group of grooves therebetween;
   (B) providing a second plurality of projections extending downwardly from said bottom surface of said first enclosure, wherein said second plurality of projections are spaced to define a second group of grooves therebetween, wherein each of said second group of grooves corresponds to a respective one of said first plurality of projections, wherein each of said first group of grooves corresponds to a respective one of said second plurality of projections; and
   (C) stacking said first enclosure on top of said second enclosure such that each of said second plurality of projections of said first enclosure engages its respective one of said first group of grooves of said second enclosure and each of said first plurality of projections of said second enclosure engages its respective one of said second group of grooves of said first enclosure to interlock said first enclosure with said second enclosure, wherein said step (A) for providing said first plurality of projections further comprises the steps of:
      (1) providing a first set of spaced parallel ridges running vertically from the back of said second enclosure toward its front, wherein said first set of ridges define a first set of grooves therebetween; and (2) providing a second set of spaced parallel ridges running laterally with respect to said first set of ridges, wherein said first set of ridges do not intersect said second set of ridges, wherein said second set of ridges define a second set of grooves therebetween;

wherein said step (B) for providing said second plurality of projections further comprises the steps of:

(3) providing a third set of spaced parallel ridges running vertically from the back of said first enclosure toward its front, wherein said third set of ridges define a third set of grooves therebetween; and (4) providing a fourth set of spaced parallel ridges running laterally with respect to said third set of ridges, wherein said third set of ridges do not intersect said fourth set of ridges, wherein said fourth set of ridges define a fourth set of grooves therebetween, wherein each of said first set of grooves corresponds to a respective one of said third set of ridges, wherein each of said second set of grooves corresponds to a respective one of said fourth set of ridges, wherein each of said third set of grooves corresponds to a respective one of said first set of ridges, wherein each of said fourth set of grooves corresponds to a respective one of said second set of ridges.

18. The method of claim 17, wherein said step (C) of stacking said first enclosure on top of said second enclosure further comprises the steps of:

(1) causing each of said first set of grooves of said second stackable enclosure to engage its respective one of said third set of ridges of said first enclosure, and each of said third set of grooves of said first enclosure to engage its respective one of said first set of ridges of said second enclosure to prevent any lateral movement of said first enclosure with respect to said second enclosure; and (2) causing each of said second set of grooves of said second enclosure to engaged its respective one of said fourth set of ridges of said first enclosure, and each of said fourth set of grooves of said first enclosure to engage its respective one of said second set of ridges of said second enclosure to prevent any vertical movement of said first enclosure with respect to said second enclosure.

* * * * *